United States Patent
Yu et al.

(10) Patent No.: US 11,282,745 B2
(45) Date of Patent: Mar. 22, 2022

(54) METHODS FOR FILLING FEATURES WITH RUTHENIUM

(71) Applicant: APPLIED MATERIALS, INC., Santa Clara, CA (US)

(72) Inventors: Sang-Ho Yu, Cupertino, CA (US); Seshadri Ganguli, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/396,744

(22) Filed: Apr. 28, 2019

(65) Prior Publication Data

US 2020/0343136 A1 Oct. 29, 2020

(51) Int. Cl.
| | |
|---|---|
| *H01L 21/768* | (2006.01) |
| *H01L 23/522* | (2006.01) |
| *H01L 21/02* | (2006.01) |
| *H01L 21/285* | (2006.01) |

(52) U.S. Cl.
CPC .... *H01L 21/76879* (2013.01); *H01L 21/0228* (2013.01); *H01L 21/28568* (2013.01); *H01L 21/76856* (2013.01); *H01L 23/5226* (2013.01)

(58) Field of Classification Search
CPC ......... H01L 21/76877; H01L 21/76879; H01L 21/76846; H01L 21/76876
See application file for complete search history.

(56) References Cited

U.S. PATENT DOCUMENTS

| | | | |
|---|---|---|---|
| 2002/0173054 A1 | 11/2002 | Kim | |
| 2010/0062614 A1* | 3/2010 | Ma | C23C 16/45531 438/785 |
| 2015/0371899 A1 | 12/2015 | Zhang et al. | |
| 2016/0268207 A1 | 9/2016 | Naik et al. | |
| 2017/0110368 A1 | 4/2017 | Yu et al. | |
| 2017/0226638 A1* | 8/2017 | Han | C23C 16/06 |
| 2018/0155379 A1 | 6/2018 | Schmiege et al. | |
| 2018/0347041 A1* | 12/2018 | Kim | H01L 21/76877 |

OTHER PUBLICATIONS

Kim et al. "Effect of an added iodine source (C2H5I) on Ru metal-Organic CVD," Chem. Vap. Deposition, 2003, 9 ,No. 2, 105-10 (Year: 2003).*

Kumaran et al. "The Thermal Decomposition of C2H5I" Twenty-Sixth Symposium (International) on Combustion/The Combustion Institute, 1996/pp. 605-611 (Year: 1996).*

Kim et al. "Effect of an added iodine source (C2H5I) on Ru metal-Organic CVD," Chem. Vap. Deposition, 2003, 9, No. 2, pp. 105-109 (Year: 2003).*

M. G. Kozodaev, Y. Y. Lebedinskii, A. G. Chernikova, E. V. Korostylev, A. A. Chouprik, R. R. Khakimov, Andrey M. Markeev, and C. S. Hwang , "Temperature controlled Ru and RuO2 growth via O* radical-enhanced atomic layer deposition with Ru(EtCp)2", The Journal of Chem. Phy. 151, 204701 (2019) (Year: 2019).*

International Search Report for PCT/US2020/028662, dated Sep. 14, 2020.

* cited by examiner

*Primary Examiner* — John A Bodnar

(74) *Attorney, Agent, or Firm* — Moser Taboada

(57) ABSTRACT

Methods and apparatus for filling a high aspect ratio feature such as a via with ruthenium including: contacting a ruthenium liner with a ruthenium precursor within a high aspect ratio feature such as a via, wherein the ruthenium liner has a top surface within a high aspect ratio feature such as a via, and wherein the top surface comprises a halogen material such as iodine or bromine. Embodiments also relate to selective deposition of ruthenium within a high-aspect ratio feature such as a via.

18 Claims, 6 Drawing Sheets

100
CONTACTING A RUTHENIUM LINER WITH A RUTHENIUM PRECURSOR WITHIN A HIGH ASPECT RATIO VIA, WHEREIN THE RUTHENIUM LINER HAS A TOP SURFACE WITHIN A HIGH ASPECT RATIO VIA, AND WHEREIN THE TOP SURFACE COMPRISES A HALOGEN MATERIAL — 110
FIG. 1
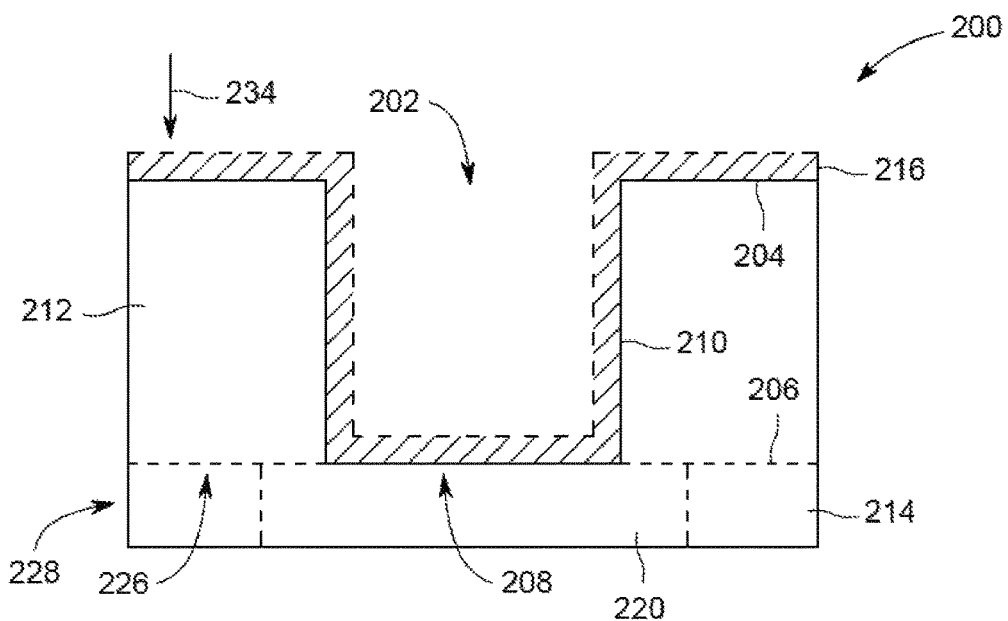
FIG. 2A
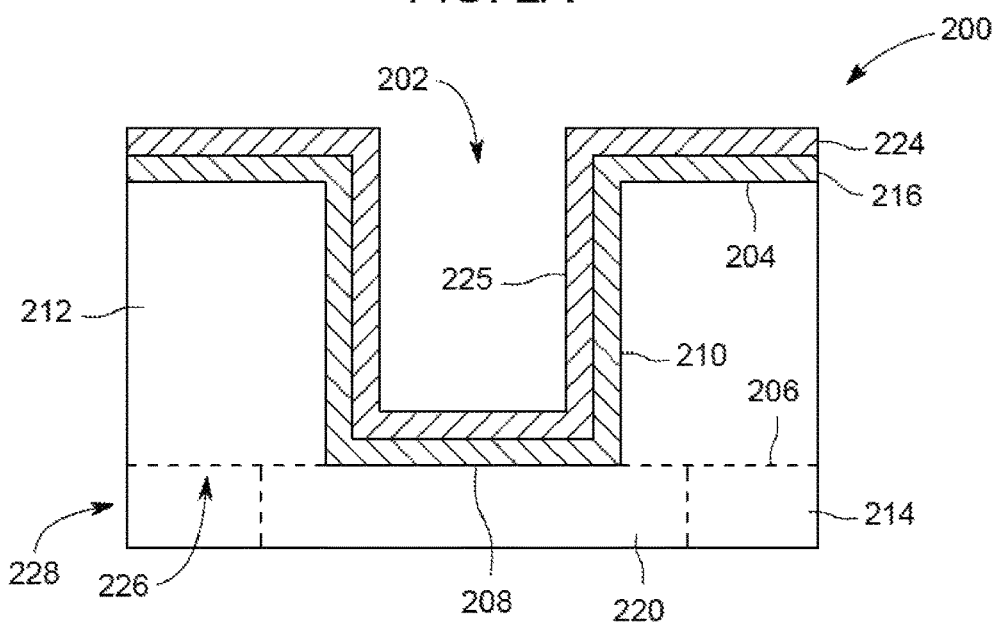
FIG. 2B

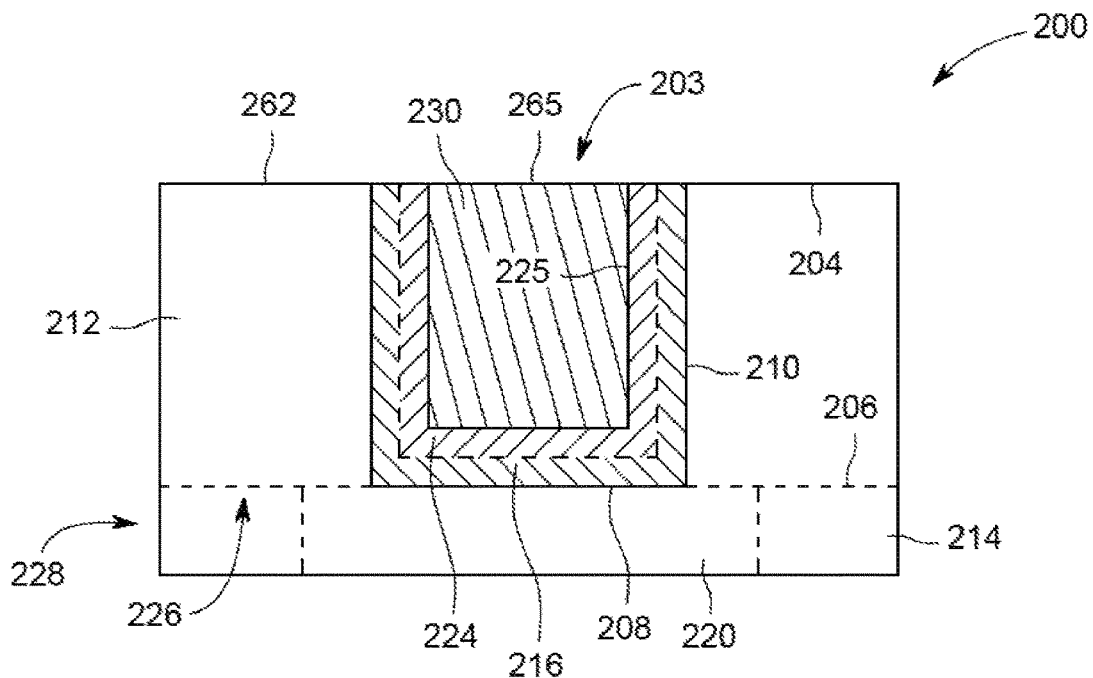

CONTACTING A METAL LINER WITHIN THE HIGH-ASPECT RATIO FEATURE WITH HALOGEN-CONTAINING MATERIAL TO ADSORB A HALOGEN ATOP THE METAL LINER TO FORM A PRETREATED METAL LINER — 310

CONTACTING THE PRETREATED METAL LINER WITH RUTHENIUM PRECURSOR TO FORM RUTHENIUM WITHIN THE HIGH-ASPECT RATIO FEATURE, WHEREIN THE RUTHENIUM PRECURSOR IS PROVIDED UNDER CONDITIONS SUFFICIENT TO REACT THE RUTHENIUM PRECURSOR TO REMOVE THE HALOGEN AND FILL THE HIGH-ASPECT RATIO FEATURE WITH RUTHENIUM — 320

FIG. 3

METHODS FOR FILLING FEATURES WITH RUTHENIUM

FIELD

Embodiments of the present disclosure generally relate to methods of processing substrates, and specifically to methods for filling ruthenium features for metal interconnect structures such as ruthenium filled vias within interconnect structures.

BACKGROUND

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Interconnects provide the electrical connections between the various electronic elements of an integrated circuit and form the connections between the circuit elements and the device's external contact elements, such as pins, for connecting the integrated circuit to other circuits. Typically, interconnect lines form horizontal connections between electronic circuit elements while conductive via plugs form vertical connections between the electronic circuit elements, resulting in layered connections.

Advances in semiconductor materials and processing techniques have resulted in reducing the overall size of the integrated circuit elements while increasing their number or density on a single body. However, the inventors have observed that, as device nodes get smaller (for example, approaching dimensions of about 22 nm or less), challenges present reducing device reliability and desired resistivity. For example, copper is an excellent conductor and has been used in chips because copper components such as metal filled vias have excellent functionality at smaller sizes. However, copper problematically diffuses throughout its surroundings or along a weak interface, unless contained, for example in a liner. The inventors have observed that the certain liners are deficient and take up too much space within a desired feature such as a high-aspect ratio via. For example, as high-aspect ratio features become smaller in diameter, the liner material problematically occupies space within the feature problematically reducing the amount of space available for a conductive material.

Thus, improved methods for forming features such as vias for interconnect structures are needed.

SUMMARY

Methods and apparatus for filling a feature disposed in a substrate such as a high aspect ratio via are provided herein. In some embodiments, a method for filling a high aspect ratio via with ruthenium includes: contacting a ruthenium liner with a ruthenium precursor within a high aspect ratio via, wherein the ruthenium liner has a top surface within a high aspect ratio via, and wherein the top surface includes a halogen material.

In some embodiments, a method for filling a high-aspect ratio feature having a metal liner, includes: contacting a metal liner within the high-aspect ratio feature with halogen-containing material to adsorb a halogen atop the metal liner to form a pretreated metal liner; and contacting the pretreated metal liner with ruthenium precursor to form ruthenium within the high-aspect ratio feature, wherein the ruthenium precursor is provided under conditions sufficient to react the ruthenium precursor to remove the halogen and fill the high-aspect ratio feature with ruthenium.

In some embodiments, a method for selectively forming ruthenium within a high aspect ratio feature includes: contacting a field of a substrate including a high aspect ratio feature with plasma or hydrogen in an amount sufficient to inhibit deposition of ruthenium in the field; and contacting a ruthenium liner within a high aspect ratio feature with a ruthenium precursor, wherein the ruthenium liner has a top surface within a high aspect ratio via, wherein the top surface includes a halogen, wherein the ruthenium precursor is provided under conditions sufficient to remove the halogen and fill the high aspect ratio feature with ruthenium. In some embodiments, the halogen is formed on the top surface of the liner by contacting the ruthenium liner with an alkyl halide.

In some embodiments, a method for filling a high aspect ratio via with ruthenium includes: contacting a substrate with a ruthenium precursor within a high aspect ratio via, wherein the substrate has a top surface within a high aspect ratio via, and wherein the top surface includes a halogen material.

In some embodiments, a method for filling a high-aspect ratio feature disposed within a substrate, includes: contacting a substrate within the high-aspect ratio feature with halogen-containing material to adsorb a halogen atop the substrate to form a pretreated substrate; and contacting the pretreated substrate with ruthenium precursor to form ruthenium within the high-aspect ratio feature, wherein the ruthenium precursor is provided under conditions sufficient to react the ruthenium precursor to remove the halogen from the substrate and fill the high-aspect ratio feature with ruthenium.

In some embodiments, a method for selectively forming ruthenium within a high aspect ratio feature includes: contacting a field of a substrate including a high aspect ratio feature with plasma or hydrogen in an amount sufficient to inhibit deposition of ruthenium in the field; and contacting the substrate within a high aspect ratio feature with a ruthenium precursor, wherein the substrate has a top surface within a high aspect ratio via, wherein the top surface includes a halogen, wherein the ruthenium precursor is provided under conditions sufficient to remove the halogen and fill the high aspect ratio feature with ruthenium. In some embodiments, the halogen is formed on the top surface of the substrate by contacting the top surface of a substrate within a high-aspect ratio feature such as a via with an alkyl halide.

In some embodiments, a method for selectively forming ruthenium within a high aspect ratio feature includes: contacting a field of a substrate including a high aspect ratio feature with plasma or hydrogen in an amount sufficient to inhibit deposition of ruthenium in the field; and contacting a metal liner within a high aspect ratio feature with a ruthenium precursor, wherein the metal liner has a top surface within a high aspect ratio via, wherein the top surface includes a halogen, wherein the ruthenium precursor is provided under conditions sufficient to remove the halogen and fill the high aspect ratio feature with ruthenium. In some embodiments, the halogen is formed on the top surface of the metal liner by contacting the metal liner with an alkyl halide.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 depicts a flow chart of a method for filling a feature in accordance with some embodiments of the present disclosure.

FIGS. 2A-E depict the stages of filling a feature in a substrate in accordance with some embodiments of the present disclosure.

FIG. 3 depicts a flow chart of a method for filling a high-aspect ratio feature having a metal liner in accordance with some embodiments of the present disclosure.

Figure 2C:
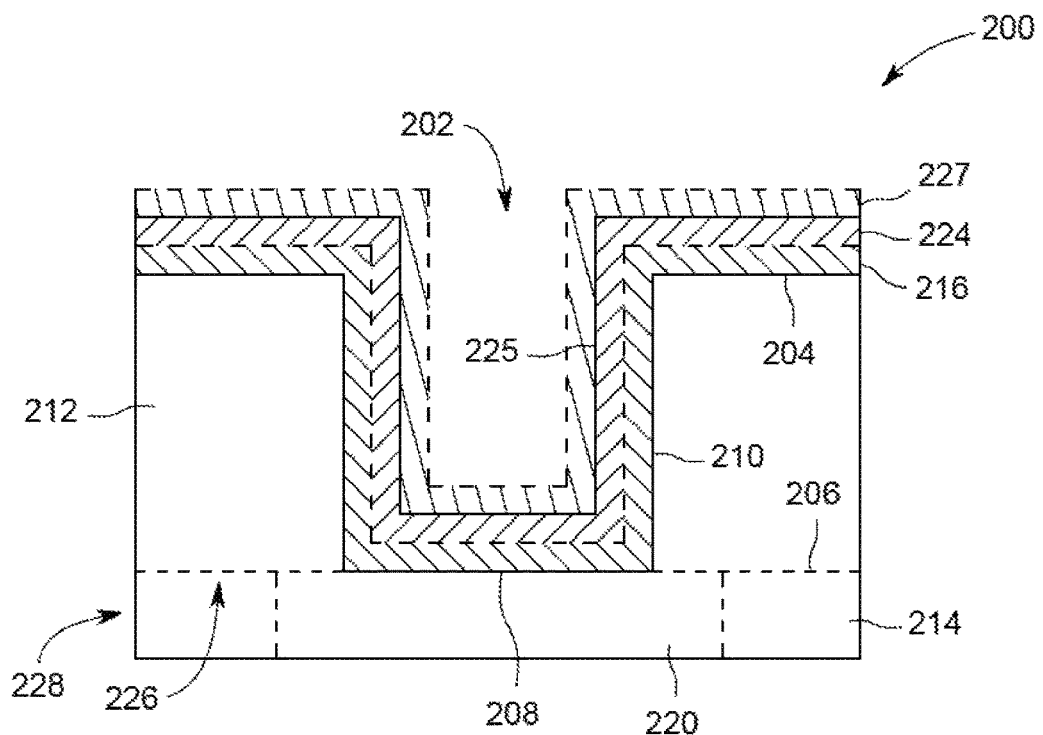

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for filling features such as vias and trenches with ruthenium for ruthenium interconnect structures are provided herein. In embodiments, the present disclosure relates to methods of filling one or more high aspect ratio features such as vias or trenches with ruthenium including: contacting a ruthenium liner with a ruthenium precursor within a high aspect ratio via, wherein the ruthenium liner has a top surface within a high aspect ratio via, and wherein the top surface includes a halogen material such as, for example iodine or bromine. In some embodiments, the present disclosure relates to methods of filling one or more high aspect ratio features such as vias or trenches with ruthenium including: contacting a substrate within a high aspect ratio via with a ruthenium precursor, wherein the substrate within the feature has a top surface within a high aspect ratio via or trench, and wherein the top surface includes a halogen material such as, for example iodine or bromine adsorbed thereon. The ruthenium filling methods advantageously facilitate improved ruthenium device properties such as low resistivity and maximizes conductive metal fill within a high-aspect ratio feature. The inventive methods may be utilized with any device nodes, but may be particularly advantageous in device nodes of about 25 nm or less, for example about 3 nm to about 25 nm, such as 20 nm, 14 nm, 7 nm, 5 nm, or 3 nm. The inventive methods may also be utilized to selectively deposit ruthenium within a high aspect ratio feature such as a via and not upon the field of the substrate surrounding the feature such as surrounding a via hole.

FIG. 1 depicts a flow chart of a method 100 for filling features such as vias and trenches with ruthenium in accordance with some embodiments of the present disclosure. The method 100 is described below with respect to an interconnect structure, as depicted in FIGS. 2A-2E. The methods of the present disclosure such as method 100 may be performed in any suitable process chambers such as, for example process chamber 500 shown in FIG. 5 configured for one or more of chemical vapor deposition (CVD), or atomic layer deposition (ALD). Exemplary processing systems that may be used to perform the inventive methods disclosed herein may include, but are not limited to, any of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including ones available from other manufacturers, may also be suitably used in connection with the teachings provided herein.

FIG. 2A depicts a substrate 200 having an opening 202 formed in a first surface 204 of the substrate 200 and extending into the substrate 200 towards an opposing second surface 206 of the substrate 200. The substrate 200 may be any suitable substrate having an opening 202 formed in the substrate. For example, the substrate 200 may include one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 212, such as silicon oxide, a low-k material (e.g., a material having a dielectric constant less than silicon oxide, or less than about 3.9), or the like. The opening 202 may be formed in the first dielectric layer 212. In some embodiments, the first dielectric layer 212 may be disposed atop a second dielectric layer 214, such as silicon oxide, silicon nitride, silicon carbide, or the like. A first conductive material (e.g., conductive material 220) may be disposed in the second dielectric layer 214 and may be aligned with the opening 202 such that the opening, when filled with a second conductive material such as ruthenium, provides an electrical path to and from the first conductive material.

The opening 202 may be any opening, such as a via, trench, dual damascene structure, or the like. In some embodiments, the opening 202 may have a height to width aspect ratio of about 4:1 or more such as 4:1 to 9:1, or 4:1 to 20:1 (e.g., a high aspect ratio). In some embodiments, opening 202 is a via hole having a diameter of 25 nm or less, for example about 3 nm to about 25 nm, such as 20 nm, 14 nm, 7 nm, 5 nm, or 3 nm. The opening 202 may be formed by etching the substrate 200 using any suitable etch process. The opening 202 includes a bottom surface 208 and sidewalls 210.

In some embodiments, the substrate 200 may include a high aspect ratio via without any additional liners or layers within the high aspect ratio via prior to filling with ruthenium in accordance with the present disclosure. In some embodiments, such as an ALD process described herein, halogen-containing material may be contacted with the substrate within a via under conditions suitable to adsorb halogen material upon the sidewalls 210 and bottom surface 208. In embodiments, an ALD process described below is suitable for partially or completely filling the feature e.g., greater that 30%, such as by contacting a substrate within the high-aspect ratio feature with halogen-containing material to adsorb a halogen atop the substrate to form a pretreated substrate; and contacting the pretreated substrate (such as within a high-aspect ratio via) with ruthenium precursor to form ruthenium within the high-aspect ratio feature, wherein the ruthenium precursor is provided under conditions sufficient to react the ruthenium precursor to remove the halogen from the substrate and fill the high-aspect ratio feature with ruthenium. In some embodiments, the halogen may remain available for further reaction with ruthenium precursor by migrating to the top or outer surface of ruthenium formed in accordance with the methods of the present disclosure. In some embodiments, the halogen is available as a catalyst to facilitate additional formation of ruthenium within the high-aspect ratio feature. In some embodiments, the ruthenium fill of the high-aspect ratio feature is characterized as a bottom-up fill.

Returning back to FIG. 2A, in some embodiments, the substrate 200 may optionally be covered with one or more layers prior to depositing a liner such as a metal liner or ruthenium liner or ruthenium fill material as described below. For example, the sidewalls 210 of the opening 202, the bottom surface 208 of the opening, and the first surface 204 of the substrate 200 may be covered by a barrier layer 216 (shown in phantom). The barrier layer 216 may serve to prevent diffusion of a subsequently deposited metal layer into underlying layers, such as first dielectric layer 212. The barrier layer 216 may include any material suitable to act as a barrier. For example, in some embodiments, the barrier layer 216 may include a metal, for example, titanium (Ti), tantalum (Ta), cobalt (Co), manganese (Mn), tungsten (W), hafnium (Hf), alloys thereof, or the like, or in some embodiments, a metal nitride, such as titanium nitride (TiN), tantalum nitride (TaN), tungsten nitride (WN), or the like. The barrier layer 216 may have any thickness suitable to prevent the diffusion of subsequently deposited metal layer materials into underlying layers. For example, in some embodiments, the barrier layer 216 layer may have a thickness of about 10 to about 50 angstroms. The barrier layer 216 may be formed by any process suitable to provide the barrier layer 216 having a suitable thickness. For example, in some embodiments, the barrier layer 216 may be formed via a deposition process, such as chemical vapor deposition, physical vapor deposition, or a cyclical deposition process, for example, such as atomic layer deposition, or the like.

In some embodiments, and as illustrated by dotted lines in FIG. 2A, the opening 202 may extend completely through the substrate 200 and an upper surface 226 of a second substrate 228 and may form the bottom surface 208 of the opening 202. The second substrate 228 may be disposed adjacent to the second surface 206 of the substrate 200. Further (and also illustrated by dotted lines), a first conductive material (e.g., conductive material 220), for example as part of a device, such as a logic device or the like, or an electrical path to a device requiring electrical connectivity, such as a gate, a contact pad, a conductive line or via, or the like, may be disposed in the upper surface 226 of the second substrate 228 and aligned with the opening 202. In some embodiments, the first conductive material (e.g., 220) aligned with the opening 202 may include ruthenium.

Referring to FIG. 2B, in some embodiments, the substrate 200 may include a liner 224 such as a metal liner or ruthenium liner disposed atop the substrate such as first dielectric layer 212 or optionally a barrier layer 216 (shown in phantom). The liner 224 having a top surface 225 may be formed by any process suitable to provide the liner 224 having a suitable thickness. For example, in some embodiments, the liner 224 may be formed via a deposition process, such as chemical vapor deposition, or a cyclical deposition process, for example, such as atomic layer deposition (ALD), or the like. In embodiments, the liner 224 may have a thickness of about 10 to about 50 angstroms. In some embodiments, the liner 224 has a top surface 225 that is disposed only within a high-aspect ratio via. For example, in embodiments, a portion of liner 224 may be removed from above first surface 204 by a planarization technique, leaving only top surface 225 of liner 224 within the via as shown in FIG. 2E.

In some embodiments, the substrate such as first dielectric layer 212 or barrier layer 216 is exposed to a ruthenium precursor 234 to form a liner 224 such as a ruthenium liner on the first dielectric layer 212 or barrier layer 216 disposed upon the sidewalls 210 and the bottom surface 208 of the opening 202. Optionally, liner 224 may be disposed directly atop first surface 204 of the substrate 200 and on the sidewalls 210 and the bottom surface 208 of the opening 202. In some embodiments, the substrate 200 may be heated prior to depositing the liner 224. In embodiments, the liner 224 is deposited to a thickness of about 10 to 100 angstroms. In embodiments, the liner 224 is conformally deposited to cover the sidewalls and bottom surface of the via, without filling the via such as a high aspect ratio via. In some embodiments, liner 224 is deposited according to methods described in U.S. Pat. No. 7,910,165 entitled Ruthenium Layer Formation for Copper Film Deposition to Applied Materials, Inc. In some embodiments, liner 224 is a ruthenium liner comprising or consisting of ruthenium and having a thickness of about 10 to 100 angstroms. In some embodiments, liner 224 is a ruthenium liner comprising or consisting of ruthenium and having a thickness of about 10 to 100 angstroms including about 30 angstroms, about 40 angstroms, or about 50 angstroms, and wherein the ruthenium liner is deposited atop a barrier layer 216 (shown in phantom in FIG. 2B).

In embodiments, liner 224 is a ruthenium liner formed by an ALD process. For example, liner 224 may be a ruthenium liner formed by an ALD process to a substrate or substrate including a barrier layer in the process chamber 500 of FIG. 5. In embodiments, a ruthenium liner formation by ALD may include providing pulses of a ruthenium precursor, such as p-cymene Ru hexadiene from gas sources 504 at a flow rate between about 0.01 sccm and about 5 sccm, or between about 0.1 sccm and about 1 sccm, for a pulse time of about 10 seconds or less, such as about 1.5 seconds to 5 seconds, about 0.1 seconds to 2 seconds. Pulses of a reducing gas may be provided from gas sources 504 at a flow rate between about 1 sccm and about 1,000 sccm for a pulse time of about 2 seconds or less. A noble purge gas such as argon at a flow rate between about 500 sccm and about 5,000 sccm may be continuously provided or pulsed from gas sources 504. The time between pulses of ruthenium precursor may be about 0.5 seconds or less, such as about 0.1 seconds or less, and as low as about 0.07 seconds or less. In embodiments, the heater temperature is maintained from about 100° C. to about 600° C., such as about 400° C. The chamber pressure is maintained from about 0.1 Torr to about 20 Torr, or about from about 1.0 Torr to about 10 Torr, for example, at about 1.5 Torr. In embodiments, an ALD process provides a ruthenium layer with a thickness from about 0.1 angstroms to about 1.0 angstroms per ALD cycle. The alternating sequence may be repeated until a desired thickness is achieved. For example, in embodiments, the ALD process is cycled about 50 to 60 times for a thickness of about 40 angstroms. In embodiments, when for example using ALD to form liner 224, the ruthenium precursor may be preselected such that the ruthenium precursor has a thermal decomposition temperature that is greater than the deposition temperature of the ruthenium precursor. For example, in some ALD deposition embodiments, P-cymene Ru hexadiene is preselected as it has a thermal decomposition temperature of greater than 400° C. or higher than a deposition temperature of the ALD process such as about 400° C.

In some embodiments, the ALD conditions above are suitable for contacting a substrate without any layers or liners within a high-aspect ratio feature with ruthenium precursor, such as where the substrate is pretreated by contacting the top or exposed surface of the substrate within the high-aspect ratio feature with halogen-containing material as described herein.

In other embodiments, liner 224 is a ruthenium liner formed by a chemical vapor deposition (CVD) process. For example, liner 224 may be a ruthenium layer formed by a CECVD process to a substrate in the process chamber 500 of FIG. 5. In embodiments, a CVD process including a ruthenium precursor provides a liner 224 having a thickness of about 10 to 100 angstroms. In some embodiments, the ruthenium liner has a thickness of about 10 to 100 angstroms including about 30 angstroms, about 40 angstroms, or about 50 angstroms, and wherein the ruthenium liner is deposited atop a barrier layer or directly atop a substrate without a barrier layer.

In some embodiments, ruthenium precursors suitable for use herein include ruthenium-containing compounds including ruthenium and at least one open chain dienyl ligand, such as $CH_2CRCHCRCH_2$, where R is independently an alkyl group or hydrogen. In some embodiments, the ruthenium containing compound has two open-chain dienyl ligands, such as pentadienyl or heptadienyl. In some embodiments, a bis(pentadienyl)ruthenium compound has a generic chemical formula $(CH_2CRCHCRCH_2)_2Ru$, where R is independently an alkyl group or hydrogen is suitable for use herein. In embodiments, R is independently hydrogen, methyl, ethyl, propyl or butyl. In some embodiments, ruthenium-containing compounds may include bis(dialkylpentadienyl)ruthenium compounds, bis(alkylpentadienyl)ruthenium compounds, bis(pentadienyl)ruthenium compounds and combinations thereof.

Non-limiting examples of ruthenium-containing compounds include bis(2,4 dimethylpentadienyl)ruthenium, bis (2,4-diethylpentadienyl)ruthenium, bis(2,4-diisopropylpentadienyl)ruthenium, bis(2,4-ditertbutylpentadienyl) ruthenium, bis(methylpentadienyl) ruthenium, bis (ethylpentadienyl) ruthenium, bis(isopropylpentadienyl) ruthenium, bis(tertbutylpentadienyl) ruthenium, derivatives thereof and combinations thereof. In some embodiments, other ruthenium-containing compounds include tris(2,2,6,6-tetramethyl-3,5-heptanedionato)ruthenium, dicarbonyl pentadienyl ruthenium, ruthenium acetyl acetonate, (2,4-dimethylpentadienyl)ruthenium(cyclopentadienyl), bis(2,2,6,6-tetramethyl-3,5-heptanedionato)ruthenium(1,5-cyclooctadiene), (2,4-dimethylpentadienyl)ruthenium (methylcyclopentadienyl), (1,5-cyclooctadiene)ruthenium (cyclopentadienyl), (1,5-cyclooctadiene)ruthenium (methylcyclopentadienyl), (1,5-cyclooctadiene)ruthenium (ethylcyclopentadienyl), (2,4-dimethylpentadienyl) ruthenium(ethylcyclopentadienyl), (2,4-dimethylpentadienyl)ruthenium (isopropylcyclopentadienyl), bis(N, N-dimethyl 1,3-tetramethyl diiminato)ruthenium(1,5-cyclooctadiene), bis (N,N-dimethyl 1,3-dimethyl diiminato)ruthenium(1,5-cyclooctadiene), bis(allyl)ruthenium(1,5-cyclooctadiene), (.eta.sup.6-$C_6H_6$)ruthenium(1,3-cyclohexadiene), bis(1,1-dimethyl-2 aminoethoxylato)ruthenium(1,5-cyclooctadiene), bis(1,1-dimethyl-2 aminoethylaminato)ruthenium(1,5-cyclooctadiene), derivatives thereof and combinations thereof.

In some embodiments, ruthenium precursors suitable for use in accordance with the present disclosure include p-cymene based ruthenium complexes such as p-cymene Ru hexadiene. In one embodiment an example of a ruthenium precursor includes p-cymene Ru hexadiene. In some embodiments, the ruthenium precursors are devoid of oxygen, nitrogen, such that they have no O and/or N in the ruthenium precursor.

Referring now to FIG. 2C, following formation of the liner 224 such as a ruthenium liner, a halogen-containing material is contacted with the top surface 225 of liner 224 to deposit a halogen material 227 atop top surface 225. In some embodiments, halogen material 227 forms atop top surface 225 including within a via such as a high aspect ratio via under conditions suitable for depositing halogen thereon, or forming halogen deposits such as a monolayer of halogen material 227 thereon. In embodiments, methods of the present disclosure include providing a halogen material 227 atop the top surface 225 of liner 224 by contacting the top surface with a halogen-containing material. In some embodiments, halogen-containing material comprises a halogen such as iodine or bromine bonded to a ligand. In some embodiments, the halogen-containing material is an alkyl halide. In some embodiments, the alkyl halide comprises or consists of alkyl iodide, alkyl bromide, or combinations thereof. In some embodiments, the alkyl halide comprises or consists of alkyl iodide. In some embodiments, the alkyl halide comprises or consists of alkyl bromide. In some embodiments, the halogen-containing material is one or more iodane molecules such as an organic derivative or iodine. Non-limiting examples of suitable iodane molecules for use herein include one or more organoiodine compounds with the general formula RI such as $CH_3I$ or $C_6H_5I$. In embodiments, diiodomethane or methylene iodide (MI) is a suitable organoiodine compound suitable for use in accordance with the present disclosure. In embodiments, halogen-containing material contacts the top surface 225 of a liner 224 such as a ruthenium liner or metal liner in an amount sufficient and under suitable conditions to form a monolayer of halogen, such as a monolayer of iodine or monolayer of bromine atop or adsorbed upon the top surface 225 of the liner 224.

In embodiments the halogen-containing material is preselected depending upon the ruthenium deposition process type. For example, where ALD contacts a ruthenium precursor with a substrate, metal liner, or ruthenium liner within a high aspect ratio via, a halogen-containing material having a thermal decomposition temperature that is about equal to a deposition temperature of the ruthenium precursor is selected. For example, in embodiments, a suitable halogen-containing material for an ALD process includes diiodomethane. In embodiments, diiodomethane is preselected and used as its thermal decomposition temperature (greater than 300° C.) is close to the deposition temperature of 280-290° C. In some embodiments, halogen-containing material in an ALD process is preselected due to the inclusion of a barrier layer 216 such as a barrier layer comprising titanium nitrate (TiN) on which adsorption of alkyl halides such as alkyl bromide and alkyl iodide is poor. In embodiments, in order to obtain a film of halogen material such as halogen material 227 with reduced nucleation delay and less roughness, it may be desirable to select diiodomethane as a halogen-containing material.

In embodiments the halogen-containing material is preselected depending upon the ruthenium deposition process type, such as for example a chemical vapor deposition where a CVD technique deposits the liner 224 such as a ruthenium liner. In embodiments, contacting a ruthenium precursor with a ruthenium liner within a high aspect ratio via is a chemical vapor deposition (CVD) process including a halogen-containing material having a thermal decomposition temperature that is higher than a deposition temperature of the ruthenium precursor. In some embodiments, a CVD process comprises alkyl iodide as a preselected halogen-containing material to ensure there is no thermal decomposition of the iodide at the deposition temperature. In embodiments, ethyl iodide is suitable for use herein. In embodiments, at deposition temperature during a CVD process, alkyl iodide adsorption leads to adsorbed iodide on the top surface 225 and the alkyl desorbs allowing a larger concentration of adsorbed iodine including spaced deposits or a monolayer of halogen material.

In some embodiments, halogen-containing material is preselected depending on selectivity, film properties, and/or process (ALD vs CECVD). For ALD process with no selectivity, halogen-containing material may be selected close to its thermal decomposition temperature to obtain smooth film. In some embodiments, adsorbed iodine or free iodine radical on the surface can take part in the reaction to form ruthenium within the feature or via. Process temperature may also play a role in selection as where the process is performed at a temperature higher than thermal decomposition temperature, carbon from halogen-containing material such as alkyl iodide precursor may be incorporated in the film. In some embodiments, such as for CECVD process or processes requiring selectivity, the halogen-containing material such as alkyl iodide may be chosen to be below a decomposition point, such that only adsorbed iodine is available on the surface and available for further reaction.

Figure 2D:
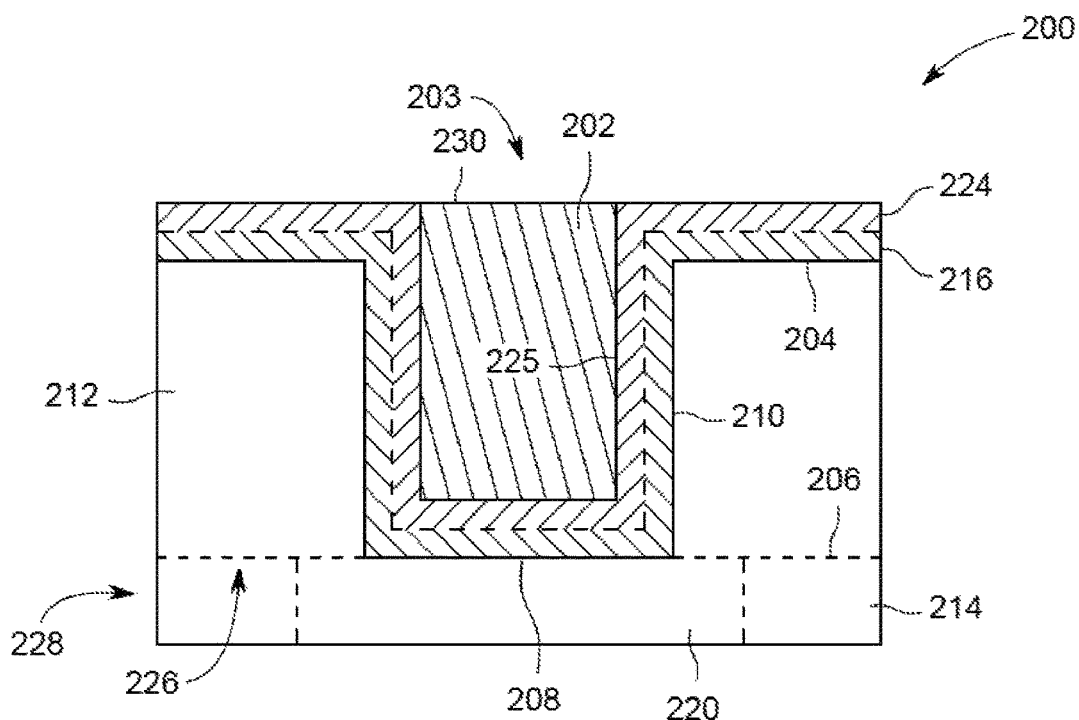

Referring now to FIG. 2D, in embodiments, a conductive material such as second conductive material 230 may be deposited on the liner 224. For example, the second conductive material 230 may be deposited on a liner 224 disposed directly atop the sidewalls 210 and the bottom surface 208 of the feature, to form a conductive layer, or optionally atop a barrier layer 216 (shown in phantom in FIG. 2D), or even optionally directly atop substrate within a high-aspect ratio feature without liners or other layers within the feature. In some embodiments, the conductive material is deposited atop the upper surface of the substrate. In some embodiments, the second conductive material 230 may be deposited by ruthenium soak process where ruthenium precursor is flowed into the process chamber 500. In embodiments, a ruthenium soak process where ruthenium precursor is flowed into the process chamber 500 for about 100 to 600 seconds, such as about 500 seconds, deposits and fills the feature such as via 203. In embodiments, the second conductive material 230 is ruthenium.

In some embodiments, second conductive material 230 is ruthenium deposited by contacting a ruthenium precursor with a liner 224 such as a ruthenium liner within a high aspect ratio via such as via 203. In embodiments, the liner 224 such as a ruthenium liner has a top surface 225 within a high aspect ratio via such as via 203. In some embodiments, top surface 225 included a halogen material 227 such as iodine or bromine deposited or layered thereon, however referring to FIG. 2D, the halogen material may be removed or entirely removed upon contact with ruthenium precursor provided to fill the via. In some embodiments, contacting a ruthenium precursor with a liner 224 such as a ruthenium liner includes contacting the liner 224 such as a ruthenium liner with an amount of ruthenium precursor sufficient to fill the high aspect ratio via with ruthenium as shown as second conductive material 230 in FIG. 2D. In some embodiments, contacting a ruthenium precursor with a ruthenium liner includes contacting the ruthenium liner with an amount of ruthenium precursor sufficient to remove the halogen material, such as by removing the halogen material from the high aspect ratio via. In embodiments, liner 224 having halogen material atop or directly atop top surface 225 is contacted or soaked with ruthenium precursor for about 100 to 600 seconds, such as about 500 seconds.

Referring now to FIG. 2E, an interconnect structure including a high-aspect ratio via filled with second conductive material 230 is shown. In embodiments, the interconnect structure is subjected to chemical mechanical planarization such that second conductive material 230 is disposed within the high aspect-ratio via, and not upon the field 262 of the substrate adjacent via hole 265. In embodiments, second conductive material 230 is ruthenium. In embodiments, the device of FIG. 2E does not include halogen material between second conductive material 230 and liner 224 such as a ruthenium liner. In some embodiments, interconnect structures formed by ALD methods of the present disclosure include conductive material 230 filling the entire high aspect-ratio via, and not upon the field 262 of the substrate adjacent via hole 265 without liner 224 or barrier layer 216. In embodiments, second conductive material 230 is ruthenium.

In some embodiments, the device of FIG. 2E may be formed by a method of filling a high aspect ratio via such as via 203 with ruthenium including optionally depositing a barrier layer 216 such as a barrier layer of titanium nitrate having a thickness in the amount of 10 to 40 angstroms such as 20 angstroms. Subsequent to the deposition of barrier layer 216 e.g., titanium nitrate, an atomic layer deposition process deposits the liner 224 comprised or consisting of ruthenium to a thickness of about 30 to 50 angstroms atop the top surface of the barrier layer 216 of titanium nitrate, followed by a soak of halogen-containing material such as alkyl halide, followed by a soak of ruthenium precursor for about 100 to a 1000 seconds, such as 500 seconds. In embodiments, a ruthenium precursor is chosen with high thermal decomposition temperature. In embodiments, the ruthenium precursor decomposition temperature is greater than the deposition temperature.

Referring now to FIG. 3, embodiments, of the present disclosure include process sequence 300 for a method of filling a high-aspect ratio feature having a liner, wherein the liner is a metal liner. In embodiments, the process sequence 300 includes at 310 contacting a metal liner within the high-aspect ratio feature with halogen-containing material to adsorb a halogen atop the metal liner to form a pretreated metal liner. For example, referring to FIG. 2E, liner 224 may include a metal liner, including ruthenium, cobalt, another metal, or combinations of ruthenium with another metal such as a combination of ruthenium and cobalt. In embodiments, the process sequence 300 includes at 320 contacting the pretreated metal liner with ruthenium precursor to form ruthenium within the high-aspect ratio feature, wherein the ruthenium precursor is provided under conditions sufficient to react the ruthenium precursor to remove the halogen and fill the high-aspect ratio feature with ruthenium. In embodiments, the metal liner comprises ruthenium. In embodiments, the ruthenium precursor is preselected such that it is devoid of nitrogen or oxygen atoms.

Figure 4:
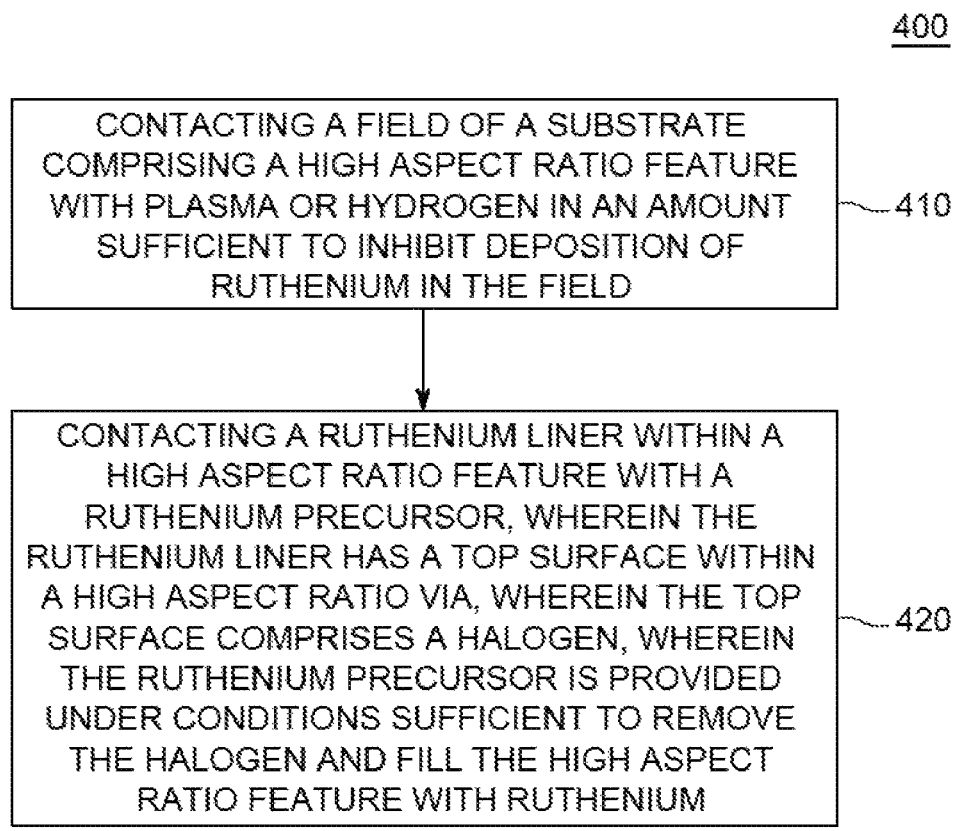
FIG. 4 depicts a flow chart of a method for selectively forming ruthenium within a high aspect ratio feature in accordance with some embodiments of the present disclosure.

Referring now to FIG. 4, embodiments, of the present disclosure include process sequence 400 for a method of selectively forming ruthenium within a high aspect ratio feature. In embodiments, halogen-containing material adsorbed or disposed upon the field and hole area of a feature may be reduced or deactivated by by contacting the field of a substrate with a plasma. In embodiments, plasma such as $H_2$ plasma, NH3 plasma, mixtures of argon plasma, or low flow of molecular $H_2$ are applied in amounts sufficient to reduced or deactivated halogen material. In embodiments, contacting the field with plasma will inhibit or eliminate the growth of ruthenium in the field of the substrate and via hole area allowing partial bottom up fill of ruthenium, or full feature fill of ruthenium. In embodiments, chemical mechanical planarization of ruthenium may be avoided and promote integration of ruthenium. Referring to FIG. 4, the methods includes at process sequence 410 contacting a field (such as field 262 of FIG. 2E) of a substrate including a high aspect ratio feature such as via 203 with plasma or hydrogen in an amount sufficient to inhibit deposition of ruthenium in the field. Subsequent to the plasma treatment, the process sequence includes at 420 contacting a liner 224 such as a ruthenium liner within a high aspect ratio feature such as via 203 with a ruthenium precursor, wherein the liner 224 is a ruthenium liner having a top surface within a high aspect ratio via, wherein the top surface includes a halogen, wherein the ruthenium precursor is provided under conditions sufficient to remove the halogen and fill the high aspect ratio feature with ruthenium. In some embodiments, the halogen is formed by contacting the ruthenium liner with an alkyl halide or halogen-containing material as described herein in e.g., amounts sufficient to react with ruthenium precursor and deposit ruthenium within the feature or on the sidewalls of a feature.

In some embodiments, a method for selectively forming ruthenium within a high aspect ratio feature includes: contacting a field of a substrate including a high aspect ratio feature with plasma or hydrogen in an amount sufficient to inhibit deposition of ruthenium in the field; and contacting the substrate within a high aspect ratio feature with a ruthenium precursor, wherein the substrate has a top surface within a high aspect ratio via, wherein the top surface includes a halogen, wherein the ruthenium precursor is provided under conditions sufficient to remove the halogen and fill the high aspect ratio feature with ruthenium. In some embodiments, the halogen is formed on the top surface of the substrate by contacting the top surface of a substrate within a high-aspect ratio feature such as a via with an alkyl halide.

In some embodiments, a method of filling a high aspect ratio via with ruthenium includes: contacting a ruthenium liner with a ruthenium precursor within a high aspect ratio via, wherein the ruthenium liner has a top surface within a high aspect ratio via, and wherein the top surface includes a halogen material. In embodiments, the ruthenium liner is a ruthenium layer formed on a substrate disposed in a process chamber, by process sequences including: (a) exposing the substrate to a ruthenium precursor to form a ruthenium layer on a first surface of the substrate and on sidewalls and a bottom surface of a feature formed in the first surface of the substrate, wherein the feature has an aspect ratio of about 6:1 to about 20:1; (b) purging the process chamber of the ruthenium precursor; (c) exposing the substrate to a first process gas; (d) purging the first process gas from the process chamber; (e) repeating (a)-(d) to desired thickness of the ruthenium liner; (f) contacting the liner with a halogen containing material; and (g) contacting the liner and/or liner with halogen-containing material with additional ruthenium precursor to fill the via. In embodiments, the via includes void-free ruthenium plug of conductive material.

In embodiments, a suitable deposition chamber for depositing the barrier layers, liner, and second conductive material such as ruthenium is a CVD process chamber 500. Such a process chamber 500 is available from Applied Materials, Inc. located in Santa Clara, Calif. In embodiments, the process chamber 500 may be part of a processing system shown in FIG. 6 including multiple processing chambers connected to a central transfer chamber and serviced by a robot. The process chamber 500 includes walls 506, a bottom 508, and a lid 510 that define a process volume 512. The walls 506 and bottom 508 are typically fabricated from a unitary block of aluminum. The walls 506 may have conduits (not shown) therein through which a fluid may be passed to control the temperature of the walls 506. The process chamber 500 may also include a pumping ring 514 that couples the process volume 512 to an exhaust port 516 as well as other pumping components (not shown). A substrate support assembly 538, which may be heated, may be centrally disposed within the process chamber 500. The substrate support assembly 538 supports a substrate 503 during a deposition process. The substrate support assembly 538 generally is fabricated from aluminum, ceramic or a combination of aluminum and ceramic and typically includes a vacuum port (not shown) and at least one or more heating elements 532.

In embodiments, a vacuum port may be used to apply a vacuum between the substrate 503 and the substrate support assembly 538 to secure the substrate 503 to the substrate support assembly 538 during the deposition process. The one or more heating elements 532, may be, for example, electrodes disposed in the substrate support assembly 538, and coupled to a power source 530, to heat the substrate support assembly 538 and substrate 503 positioned thereon to a predetermined temperature.

Figure 5:
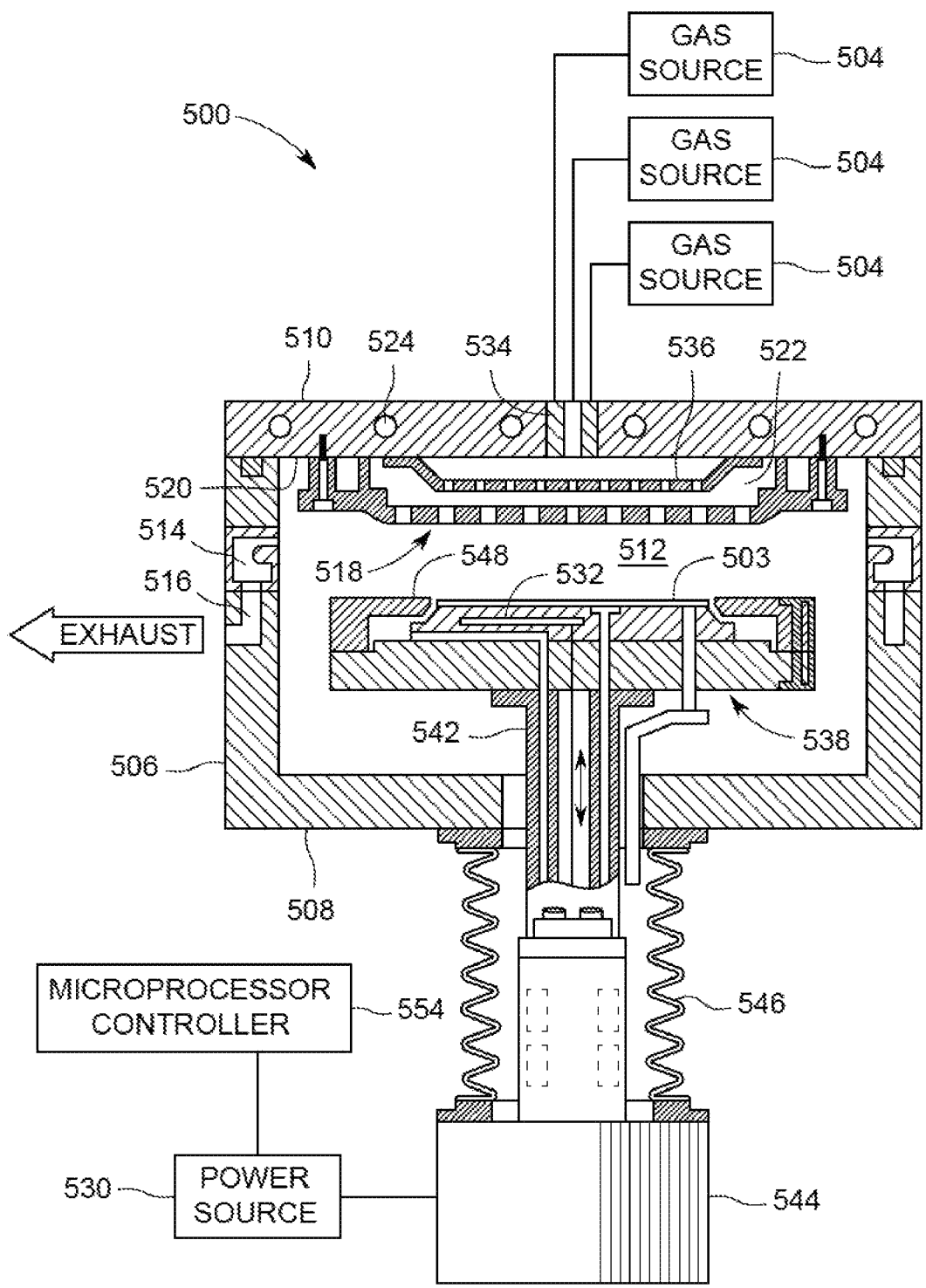
FIG. 5 depicts a deposition chamber suitable for performing one or more methods in accordance with embodiments of the present disclosure.

In embodiments, the substrate support assembly 538 is coupled to a stem 542. The stem 542 provides a conduit for electrical leads, vacuum and gas supply lines between the substrate support assembly 538 and other components of the process chamber 500. Additionally, the stem 542 couples the substrate support assembly 538 to a lift system 544 that moves the substrate support assembly 538 between an elevated position (as shown in FIG. 5) and a lowered position (not shown). Bellows 546 provide a vacuum seal between the process volume 512 and the atmosphere outside the process chamber 500 while facilitating the movement of the substrate support assembly 538.

The substrate support assembly 538 additionally supports a circumscribing shadow ring 548. The shadow ring 548 is annular in form and typically comprises a ceramic material such as, for example, aluminum nitride. Generally, the shadow ring 548 prevents deposition at the edge of the substrate 503 and substrate support assembly 538.

The lid 510 is supported by the walls 506 and may be removable to allow for servicing of the process chamber 500. The lid 510 may generally be comprised of aluminum and may additionally have heat transfer fluid channels 524 formed therein. The heat transfer fluid channels 524 are coupled to a fluid source (not shown) that flows a heat transfer fluid through the lid 510. Fluid flowing through the heat transfer fluid channels 524 regulates the temperature of the lid 510.

A mixing block 534 may be disposed in the lid 510. The mixing block 534 may be coupled to gas sources 504. Generally, individual gas streams from the gas sources 504 may be combined in the mixing block 534. These gases are mixed into a single homogeneous gas flow in the mixing block 534 and introduced into the process volume 512 after passing through a showerhead 518 that diffuses the gas flow outwardly towards the walls 506.

The showerhead 518 may generally be coupled to an interior side 520 of the lid 510. A perforated blocker plate 536 may optionally be disposed in the space 522 between the showerhead 518 and lid 510. Gases (i.e., process and other gases) that enter the process chamber 500 through the mixing block 534 are first diffused by the blocker plate 536 as the gases fill the space 522 behind the showerhead 518. The gases then pass through the showerhead 518 and into the process chamber 500. The blocker plate 536 and the showerhead 518 are configured to provide a uniform flow of gases to the process chamber 500.

In some embodiments, at least one of the lines supplying process gas, such as ruthenium precursor in accordance with the present disclosure, from gas sources 504 to process chamber 500 advantageously includes a valve (not shown) for diverting gas flow, so that during purging of the process chamber 500 the mass flow controller (MFC) for the ruthenium precursor gas source does not need to be shut off. Diverting the flow of the ruthenium precursor during purge steps, as opposed to shutting off the flow, reduces overall throughput time by eliminating the extra time needed for the MFC to stabilize the flow of ruthenium precursor after each purge step.

The process chamber 500 can be controlled by a microprocessor controller 554. The microprocessor controller may be one of any form of general purpose computer processor or central processing unit (CPU) that can be used in an industrial setting for controlling various chambers and sub-processors. The computer processor may use any suitable memory, such as random access memory, read only memory, floppy disc drive, hard disk, or any other form of digital storage, local or remote. Various support circuits may be coupled to the CPU for supporting the processor in a conventional manner. Software routines, as required, may be stored in the memory or executed by a second CPU that is remotely located.

The software routines are executed after the substrate is positioned on the substrate support. The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

Non-limiting examples of reaction reagents and conditions for forming liners or selectively forming liners such as ruthenium liners are described in commonly owned U.S. Pat. No. 7,910,165 entitled Ruthenium Layer Formation for Copper Film Deposition to Applied Materials, Inc. In embodiments the process chamber 500 is configured to deposit ruthenium film using metal-organic precursor of the present disclosure in combination with halogen-containing materials such as an alkyl halide. In embodiments, the metal-organic precursor have no O and N in the ruthenium precursor. In embodiments, the process chamber 500 is configured for ruthenium precursor decomposition temperature to be greater than the deposition temperature. In embodiments, a ruthenium precursor with high thermal decomposition temperature above 400° C. is suitable for use herein. In embodiments, the process chamber 500 is set to a temperature of about 225° C. and configured to sequentially form upon a substrate: about 20 angstroms titanium nitride (TiN), about 40 angstroms of ruthenium formed by about 60 cycles of ALD, deposits of halogen material formed by providing about a 60 second soak with halogen-containing material, and ruthenium fill material formed from about a 500 second soak of ruthenium precursor to fill the feature. In embodiments, process chamber 500 is set to a temperature of about 200° C. and configured to deposit about 30 angstroms titanium nitride (TiN), about 40 angstroms of ruthenium formed by about 50 cycles of CVD, halogen material formed from about a 30 second soak with halogen-containing material, and conductive metal fill from about a 200 to about 500 second soak of ruthenium precursor to fill the feature.

Figure 6:
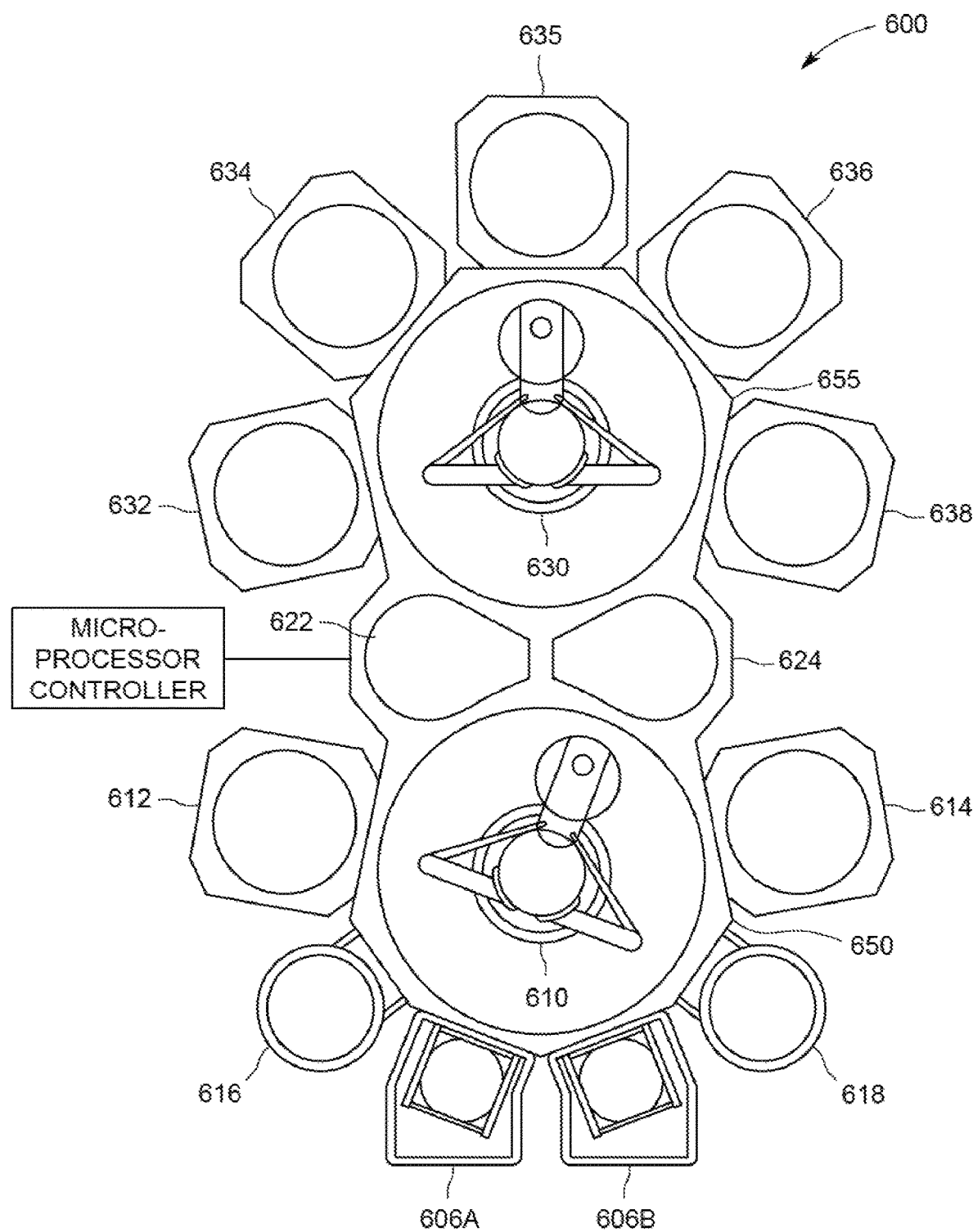
FIG. 6 depicts a cluster tool suitable for performing one or more methods in accordance with some embodiments of the present disclosure.

The methods described herein may be performed in individual process chambers that may be provided in a standalone configuration or as part of one or more cluster tools, for example, an integrated tool 600 (i.e., cluster tool) described below with respect to FIG. 6. Examples of the integrated tool 600 include the ENDURA®, CENTURA®, or PRODUCER® line of processing systems, available from Applied Materials, Inc., of Santa Clara, Calif. However, the methods described herein may be practiced using other cluster tools having suitable process chambers coupled thereto, or in other suitable process chambers.

The integrated tool 600 can include two load lock chambers 606A, 606B for transferring of substrates into and out of the integrated tool 600. Typically, since the integrated tool 600 is under vacuum, the load lock chambers 606A, 606B may pump down the pressure within the load lock chambers when substrates are introduced into the integrated tool 600. A first robot 610 may transfer the substrates between the load lock chambers 606A, 606B, and a first set of one or more substrate processing chambers 612, 614, 616, 618 (four are shown) coupled to a first transfer chamber 650. Each substrate processing chamber 612, 614, 616, 618, can be outfitted to perform a number of substrate processing operations. In some embodiments, the first set of one or more substrate processing chambers 612, 614, 616, 618 may include any combination of PVD, ALD, CVD, etch, degas, or pre-clean chambers. For example, in some embodiments, the processing chambers, 612, 614, 616, 618 include two pre-clean chambers and two degas chambers.

The first robot 610 can also transfer substrates to/from two intermediate transfer chambers 622, 624. The intermediate transfer chambers 622, 624 can be used to maintain ultrahigh vacuum conditions while allowing substrates to be transferred within the integrated tool 600. A second robot 630 can transfer the substrates between the intermediate transfer chambers 622, 624 and a second set of one or more substrate processing chambers 632, 634, 635, 636, 638 coupled to a second transfer chamber 655. The substrate processing chambers 632, 634, 635, 636, 638 can be outfitted to perform a variety of substrate processing operations including the methods described above in addition to, physical vapor deposition processes (PVD), chemical vapor deposition (CVD), etching, orientation and other substrate processes. In embodiments, the cluster tool is configured to include chambers configured for forming the interconnect structures in accordance with the present disclosure.

Referring to FIG. 2E, an interconnect structure 201 of the present disclosure may include an embodiment including: a ruthenium metal filled via disposed within a low-k dielectric layer. In embodiments, the top surface of the metal filled via is adjacent to a top surface of the low-k dielectric layer. In embodiments, the metal filled via comprises ruthenium deposited atop a liner within the metal filled via, wherein the liner comprises ruthenium. In embodiments, the metal filled via disposed within a low-k dielectric layer is a high aspect ratio via comprising a hole having a width between 5 to 20 nanometers. In some embodiments, no liner or other layers such as liner 224 and barrier layer 216 are within the via, and the entire via is filled with second conductive material such as ruthenium.

In another embodiment, a non-transitory computer readable medium having instructions stored thereon that, when executed, cause a deposition method such as e.g., a substrate treatment in accordance with the present disclosure and filling of a high-aspect ratio feature with ruthenium as described herein. For example, in embodiments, a non-transitory computer readable medium having instructions stored thereon that, when executed, cause a method of filling a high aspect ratio via with ruthenium, including contacting a ruthenium liner with a ruthenium precursor within a high aspect ratio via, wherein the ruthenium liner has a top surface within a high aspect ratio via, and wherein the top surface comprises a halogen material.

In another embodiment, a non-transitory computer readable medium having instructions stored thereon that, when executed, cause a method of filling a high-aspect ratio feature having a metal liner. For example, in embodiments, a non-transitory computer readable medium having instructions stored thereon that, when executed, cause a method of filling a high-aspect ratio feature having a metal liner, including contacting a metal liner within the high-aspect ratio feature with halogen-containing material to adsorb a halogen atop the metal liner to form a pretreated metal liner; and contacting the pretreated metal liner with ruthenium precursor to form ruthenium within the high-aspect ratio feature, wherein the ruthenium precursor is provided under conditions sufficient to react the ruthenium precursor to remove the halogen and fill the high-aspect ratio feature with ruthenium.

In another embodiment, a non-transitory computer readable medium having instructions stored thereon that, when executed, cause a method of selectively forming ruthenium within a high aspect ratio feature. For example, in embodiments, a non-transitory computer readable medium having instructions stored thereon that, when executed, cause a method of selectively forming ruthenium within a high aspect ratio feature, including contacting a field of a substrate comprising a high aspect ratio feature with plasma or hydrogen in an amount sufficient to inhibit deposition of ruthenium in the field; and contacting a ruthenium liner within a high aspect ratio feature with a ruthenium precursor, wherein the ruthenium liner has a top surface within a high aspect ratio via, wherein the top surface comprises a halogen, wherein the ruthenium precursor is provided under conditions sufficient to remove the halogen and fill the high aspect ratio feature with ruthenium.

In another embodiment, methods of the present disclosure relate to filling a high aspect ratio via with ruthenium. The process sequence of the method may include contacting a ruthenium liner, or a metal liner on which a halogen adsorbs, with a ruthenium precursor within a high aspect ratio via, wherein the ruthenium liner or metal liner has a top surface within a high aspect ratio via, and wherein the top surface comprises a halogen material. In embodiments, the halogen material is formed upon dissociative adsorption. In some embodiments, the method further includes forming the halogen material by contacting the top surface with a halogen-containing material. In embodiments, the halogen-containing material is an alkyl halide such as alkyl iodide or alkyl bromide, or combinations thereof. In embodiments, the halogen material is adsorbed upon the top surface. In some embodiments, contacting a ruthenium precursor with a ruthenium liner includes contacting the ruthenium liner with an amount of ruthenium precursor sufficient to fill the high aspect ratio via with ruthenium. In embodiments, the high aspect ratio via is completely filled. In some embodiments, the high aspect ratio via is not completely filled, and may be filled by a substantial amount such as greater than 30% such as 40%, 50%, 60%, 70, 80%, 90%, 95%, 97%, or 99%. In embodiments, the high aspect ratio via may be filled from the bottom surface towards the top surface in a bottom-up fill. In some embodiments, contacting a ruthenium precursor with a ruthenium liner includes contacting the ruthenium liner with an amount of ruthenium precursor sufficient to remove the halogen material from the top surface of the liner. In embodiments, once the ruthenium deposits in accordance with the present disclosure, the halogen moves to the top surface of the deposited ruthenium layer or film. Once the halogen is atop the top surface of the ruthenium, it is available to react with additional ruthenium precursor. In some embodiments, once the halogen is atop the top surface of the ruthenium, it is available to react with additional ruthenium precursor in additional cyclical reactions that repeat until the feature is filled to a desired amount, or filled completely.

In some ALD processes, the processes as described above may be applied to any substrate material where a halogen-containing material may provide a halogen thereto. In some embodiments, such as an ALD process, no liner as described above is needed, such that the substrate forming the high-aspect ratio feature may comprise any suitable substrate material. In some embodiments, the substrate may include one or more of a dielectric material, silicon (Si), silicon oxide, silicon germanium, a low-k material (e.g., a material having a dielectric constant less than silicon oxide, or less than about 3.9), or the like. In such embodiments, the halogen-containing material may be preselected to have a thermal decomposition temperature that is about equal to a deposition temperature of the ruthenium precursor. In embodiments, the ruthenium precursor is provided continuously or in pulses to be present under conditions suitable for an ALD process. In some embodiments, a method for filling a high aspect ratio via with ruthenium includes: contacting a substrate with a ruthenium precursor within a high aspect ratio via, wherein the substrate has a top surface within a high aspect ratio via, and wherein the top surface comprises a halogen material. In some embodiments, the method further includes forming the halogen material by contacting the top surface of the substrate with a halogen-containing material. In some embodiments, the halogen-containing material is an alkyl halide. In some embodiments, the alkyl halide is alkyl iodide or alkyl bromide, or combinations thereof. In some embodiments, the halogen material is adsorbed upon the top surface of the substrate such as within the high-aspect ratio via. In embodiments, the method includes contacting a contacting the surface of a substrate within a high-aspect ratio feature or via with an amount of ruthenium precursor sufficient to fill the high aspect ratio via with ruthenium. In embodiments, the ruthenium precursor comprises a preselected thermal decomposition temperature and a preselected deposition temperature suitable for an ALD process. In some embodiments, contacting a ruthenium precursor with substrate within a high aspect ratio via is an atomic layer deposition (ALD) process including a halogen-containing material having a thermal decomposition temperature that is about equal to a deposition temperature of the ruthenium precursor.

In some embodiments, a method for filling a high-aspect ratio feature disposed with a substrate, includes: contacting substrate within the high-aspect ratio feature with halogen-containing material to adsorb a halogen atop the substrate to form a pretreated substrate; and contacting the pretreated substrate with ruthenium precursor to form ruthenium within the high-aspect ratio feature, wherein the ruthenium precursor is provided under conditions sufficient to react the ruthenium precursor to remove the halogen from the substrate and fill the high-aspect ratio feature with ruthenium. In embodiments, the halogen acts as a catalyst and may migrate to the top surface or exposed surface of ruthenium formed in the via and remain available for additional reactions. In embodiments, the final ruthenium within the feature includes less than 1 atomic percent of halogen therein. In embodiments, halogen is completely removed from the deposited ruthenium.

In some embodiments, a method for selectively forming ruthenium within a high aspect ratio feature includes: contacting a field of a substrate comprising a high aspect ratio feature with plasma or hydrogen in an amount sufficient to inhibit deposition of ruthenium in the field; and contacting the substrate within a high aspect ratio feature with a ruthenium precursor. In some embodiments, the substrate has a top surface or exposed area within a high aspect ratio via, wherein the top surface or exposed area within the via includes a halogen in an amount sufficient to react with ruthenium precursor and form ruthenium within the via.

The invention claimed is:

1. A method of filling a high aspect ratio via with ruthenium comprising:
    contacting a top surface of a ruthenium liner within a high aspect ratio via with a ruthenium precursor, wherein the top surface comprises a halogen material, wherein filling the via is effected by reacting the ruthenium precursor with the halogen material to remove the halogen material adsorbed on the top surface, wherein the halogen material comprises or derives from deposition on the top surface of iodine, bromine, an organic iodide or a bromide compound, and wherein ruthenium precursor is devoid of oxygen, wherein ruthenium in the ruthenium precursor is coordinated with at least one open chain dienyl ligand.

2. The method of claim 1, wherein the one open chain dienyl ligand is CH2CRCHCRCH2.

3. The method of claim 1, wherein the halogen material comprises or derives from deposition on the top surface of alkyl iodide or alkyl bromide, or combinations thereof.

4. The method of claim 1, wherein contacting a ruthenium precursor with a ruthenium liner comprises contacting the ruthenium liner with an amount of ruthenium precursor effective to fully fill the high aspect ratio via with ruthenium.

5. The method of claim 1, wherein contacting a ruthenium precursor with a ruthenium liner comprises contacting the ruthenium liner with an amount of ruthenium precursor sufficient to remove the adsorbed halogen material.

6. The method of claim 1, wherein the ruthenium precursor comprises a preselected thermal decomposition temperature and a preselected deposition temperature.

7. The method of claim 1, wherein contacting a ruthenium precursor with a ruthenium liner within a high aspect ratio via is a chemical vapor deposition (CVD) process comprising a halogen-containing material having a thermal decomposition temperature that is higher than a deposition temperature of the ruthenium precursor.

8. The method of claim 1, wherein contacting a ruthenium precursor with a ruthenium liner within a high aspect ratio via is an atomic layer deposition (ALD) process comprising a halogen-containing material having a thermal decomposition temperature that is about equal to a deposition temperature of the ruthenium precursor.

9. The method of claim 1, wherein the ruthenium liner comprises ruthenium having a thickness of 10 to 100 angstroms.

10. The method of claim 1, wherein the ruthenium liner has a thickness of 10 to 100 angstroms, and wherein the ruthenium liner is deposited atop a barrier layer.

11. The method of claim 1, wherein the ruthenium precursor comprises p-cymene Ru hexadiene.

12. A method of filling a high-aspect ratio feature having a metal liner, comprising:
    contacting a metal liner within the high-aspect ratio feature with halogen-containing material to adsorb a halogen compound atop the metal liner to form a pretreated metal liner; and
    contacting the pretreated metal liner with ruthenium precursor to form ruthenium within the high-aspect ratio feature, wherein the ruthenium precursor and halogen-containing material are provided under conditions sufficient to react the ruthenium precursor with the halogen compound to remove the halogen and thereby fill the high-aspect ratio feature with ruthenium, wherein the halogen-containing material comprises iodine, bromine, an organic iodide or a bromide compound, and wherein ruthenium precursor is devoid of oxygen, wherein ruthenium in the ruthenium precursor is coordinated with at least one open chain dienyl ligand.

13. The method of claim 12, wherein the metal liner comprises ruthenium.

14. The method of claim 12, wherein the ruthenium precursor is devoid of nitrogen atoms.

15. The method of claim 12, wherein the ruthenium precursor is preselected to have a thermal decomposition temperature that is above a deposition temperature of the ruthenium precursor.

16. The method of claim 12, wherein ruthenium in the ruthenium precursor is coordinated with at least one open chain dienyl ligand.

17. The method of claim 12, wherein the one open chain dienyl ligand is $CH_2CRCHCRCH_2$.

18. A method of filling a high-aspect ratio feature having a metal liner, comprising:
    contacting a metal liner within the high-aspect ratio feature with halogen-containing material to adsorb a halogen compound atop the metal liner to form a pretreated metal liner; and
    contacting the pretreated metal liner with ruthenium precursor to form ruthenium within the high-aspect ratio feature, wherein forming the ruthenium within the high-aspect ratio feature requires reacting the ruthenium precursor and absorbed halogen compound to remove the halogen and thereby fill the high-aspect ratio feature with ruthenium, wherein the halogen-containing material comprises iodine, bromine, an organic iodide or a bromide compound, and wherein ruthenium precursor is devoid of oxygen, wherein ruthenium in the ruthenium precursor is coordinated with at least one open chain dienyl ligand.

\* \* \* \* \*